(12) United States Patent
Chen et al.

(10) Patent No.: US 6,340,916 B1
(45) Date of Patent: Jan. 22, 2002

(54) RANSIMPEDANCE AMPLIFIER CIRCUIT

(75) Inventors: Tsz-Lang Chen; Guang-Ching Leu; Chun-Yo Hsu, all of Taoyuan Hsien (TW)

(73) Assignee: Telecommunications Laboratories, Chunghwa Telecom Co., Ltd., Taoyuan Hsien (TW)

( * ) Notice: Subject to any disclaimer, the term of this patent is extended or adjusted under 35 U.S.C. 154(b) by 0 days.

(21) Appl. No.: 09/666,295

(22) Filed: Sep. 21, 2000

(51) Int. Cl.[7] .............................. H03F 3/48; H01L 31/00
(52) U.S. Cl. .......................... 330/69; 330/98; 330/110; 330/308; 333/213; 333/214; 333/215; 333/216; 250/214 A
(58) Field of Search ............................ 330/69, 98, 110, 330/308; 333/213, 214, 215, 216; 250/214 A

(56) References Cited
U.S. PATENT DOCUMENTS 5,008,524 A * 4/1991 Reutler et al. .......... 250/214 A
5,875,050 A * 2/1999 Ota ........................ 250/214 A

* cited by examiner

*Primary Examiner*—Michael B Shingleton
(74) *Attorney, Agent, or Firm*—Bacon & Thomas, PLLC

(57) ABSTRACT

An innovated transimpedance amplifier circuit consists of a buffer circuit, a simulation resistance circuit, and an amplifier circuit. The buffer circuit for inputting a signal circuit is constituted by two FETs and a resistor, and has a high current input efficiency and function of widening circuit frequency band. The simulation resistance circuit is constituted by a resistor, two buffer units, a coupling capacitor, and a biasing resistor. When operating at a low frequency, the simulating resistance circuit permits a large amount of background DC to flow through; on the other hand, when operating at a high frequency, this circuit can improve the signal coupling efficiency and reduce foreign signal output voltage. On the whole, by the circuit of the present invention, both the detecting sensitivity and the amplification factor of the signal current can be significantly improved.

8 Claims, 2 Drawing Sheets

RANSIMPEDANCE AMPLIFIER CIRCUIT

BACKGROUND OF THE INVENTION

1. Field of the invention

The present invention relates to a transimpedance amplifier circuit, and more particularly, to a transimpedance amplifier circuit with a broad frequency band, a high signal coupling efficiency, less foreign signals, and less background direct current (DC).

2. Description of the Prior Art

A conventional transimpedance amplifier circuit capable of isolating background DC is generally applicable for detecting a current signal. For example, a photosensor circuit which converting an optical signal into a current signal with a photodiode, and then converting the current signal to an output voltage signal by an amplifier is always employed as a receiving circuit in photo communication system. The main scheme thereof is shown in FIG. 1, wherein a coupling capacitor C is provided for an amplifier circuit 1 to prevent a DC current from flowing into the circuit 1. In this construction the coupling efficiency of a signal current Is is $R_1/R_1+Za$, wherein Za is an equivalent impedance viewed from the signal terminal into the amplifier circuit 1. The output signal voltage will be $Vs=Is\times[R_1\times R_2/(R_1+Za)]$, whereas output foreign signal voltage is $Vn=In\times R_2+Vn(1+R_2/R_1)$, wherein In is a foreign signal current small enough to be negligible. From the above derivation it is distinctly observable that a higher signal coupling efficiency and a lower foreign signal output voltage is obtainable from raising up the value of $R_1$. However, if the background DC $Ia$ is taken into account, wherein $Ia\times R_1<Vcc$, the amplifier circuit under consideration is still impossible to work under both too large Ra and Ia.

In order to eliminate the shortcomings inherent to the conventional circuit described above, the present inventor has delved into this matter with a long time efforts and came to realization of an improved scheme of a transimpedance amplifier circuit having the merits of a broad frequency band, a high signal coupling efficiency, less foreign signals, and less background DC.

SUMMARY OF THE INVENTION

It is an object of the present invention to provide a transimpedance amplifier circuit having the merits of a broad frequency band, a high signal coupling, efficiency, less foreign signals, and less back ground DC.

For achieving the above mentioned object, the transimpedance amplifier circuit according to the present invention consists of a buffer circuit, a simulation resistance circuit, and an amplifier circuit. The buffer circuit for inputting a signal current is constituted by two field effect transistors (FET) and a resistor, and has a high current input efficiency and function of widening circuit frequency band. The simulation resistance circuit is constituted by a resistor, two buffer units, a coupling capacitor, and a biasing resistor. When operating at a low frequency, the simulating resistance circuit permits a large amount of background DC to flow through; on the other hand, when operating at a high frequency, this circuit can improve the signal coupling efficiency and reduce foreign signal output voltage. On the whole, by means of the transimpedance amplifier circuit of the present invention, both the detecting sensitivity and the amplification factor of the signal current are greatly improved.

BRIEF DESCRIPTION OF THE DRAWINGS

The drawings disclose an illustrative embodiment of the present invention which serves to exemplify the various advantages and objects hereof, and are as follows.

DETAILED DESCRIPTION OF THE PREFERRED EMBODIMENT

Figure 1:
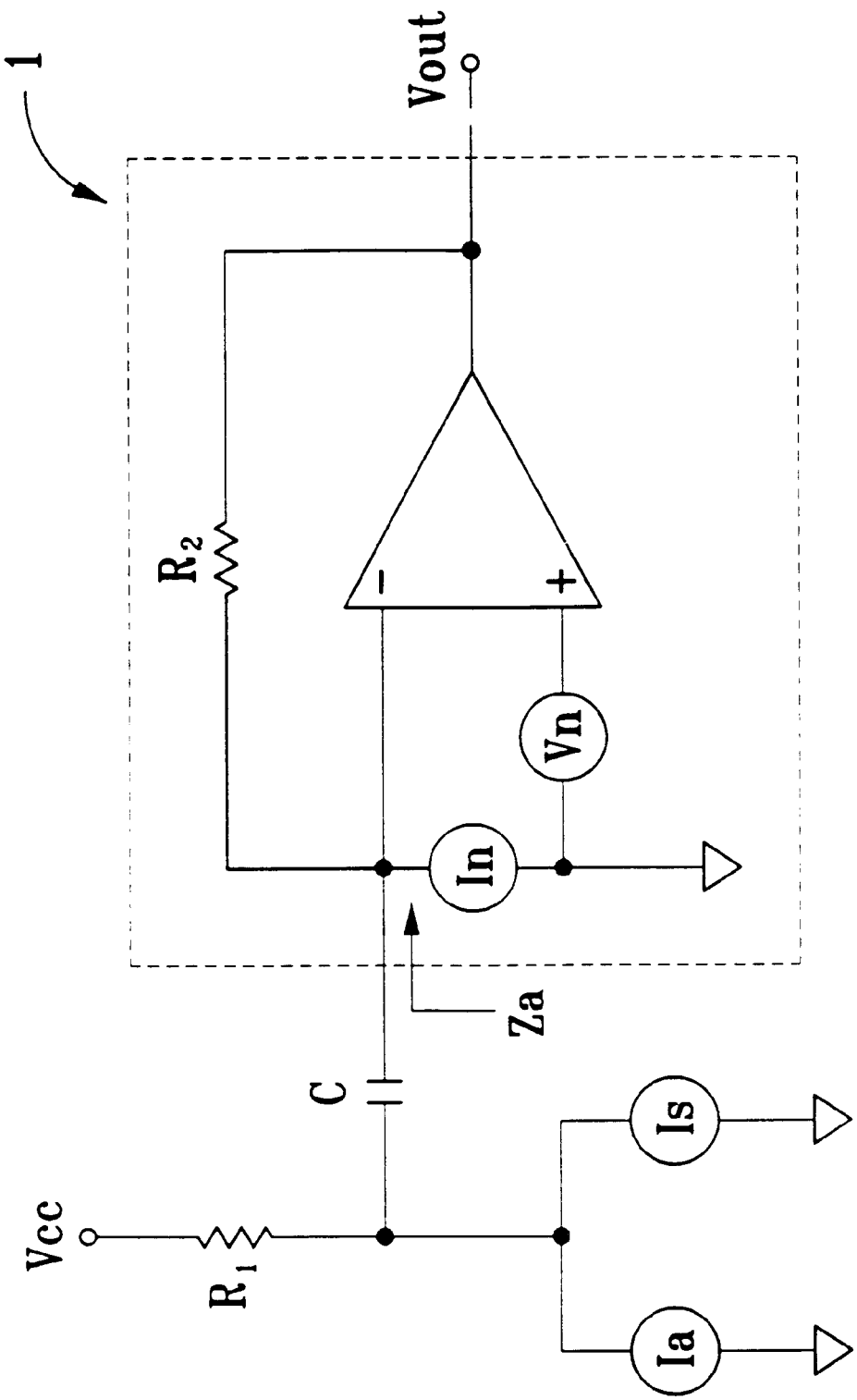
FIG. 1 is a drawing showing the conventional scheme of a transimpedance amplifier circuit with function of isolating background DC.
Figure 2:
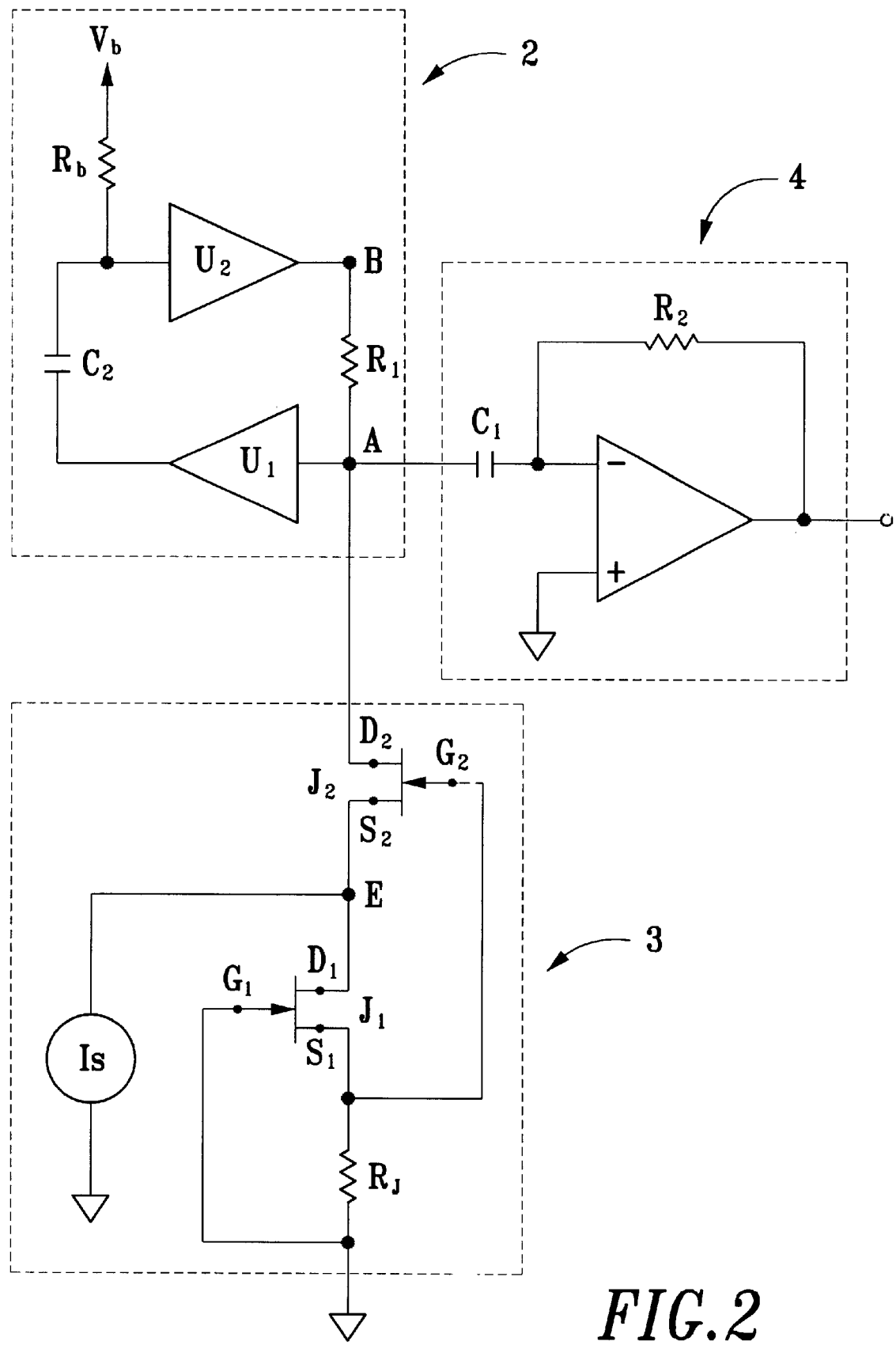
FIG. 2 is a drawing showing the scheme of a transimpedance amplifier circuit having the medits of a broad frequency band, a high signal coupling efficiency, less foreign signals, and less background DC according to the present invention.

Referring to FIG. 2, a drawing of the transimpedance amplifier circuit according to the present invention, this circuit essentially comprises a buffer circuit 3; a simulation resistance circuit 2 and an amplifier circuit 4. The buffer circuit 3 for inputting signal current is constituted by two FETS $J_1$, $J_2$ and a resistor Rj. The essential function of the buffer circuit 3 is to effectively transmit a signal current Is to an input node A of the transimpedance amplifier circuit, and also isolate a capacitance effect which might be existing in the signal source thereby widening the circuit frequency band.

The FET $J_1$ and the resistor Rj associate to form a fixed current source so as to stabilize source ($S_1$) voltage of the FET $J_1$, so that the voltage of the FET $J_1$, source $S_1$ can be provided for stabilizing the gate ($G_2$) voltage of the FET $J_2$. By so, a capacitance of the source $S_2$ of the FET $J_2$ is isolated from the drain $D_2$ of the FET $J_2$. With this current source scheme, the present invention elaborately utilizes the contact node of the drain $D_1$ of the FETF $J_1$ and the source $S_2$ of the FET $J_2$ as an input node E of the signal current so as to achieve effect of a high current input efficiency and a wide frequency band of the circuit.

As for the simulation resistor circuit 2, this circuit 2 is constituted by a resistor $R_1$, two buffer units $U_1$, $U_2$, a coupling capacitor $C_2$, and a biasing resistor Rb. The first buffer unit $U_1$ picks up the voltage at the input node A, while the output of the second buffer unit $U_2$ controls the voltage at the input node A after passing through the biasing resistor Rb. The output end of the first buffer unit $U_1$ is connected to the input end of the second buffer unit $U_2$ via the coupling capacitor $C_2$ so as to form a shoestring structure by capacitor coupling. When the simulation resistor circuit 2 is operated at a low frequency, the coupling capacitor $C_2$ is in an open circuit state so that a fixed voltage Vb is obtained at a terminal B of $R_1$. At this time the equivalent impedance viewed from the input node A into the transimpedance amplifier circuit is $R_1$ which permits great amount of background DC to flow. On the other hand, when the simulation resistor circuit 2 is operated at a high frequency, the coupling capacitor $C_2$ will be in a short circuited state, at this time the voltage at the terminal B of resistor $R_1$ varies in accordance with the voltage at input node A of the transimpedance amplifier circuit. Moreover, the voltage difference between the terminals of $R_1$ is maintained in a constant value which exhibits a very high equivalent impedance value to a high frequency signal current thereby improving coupling efficiency of the input signal to the transimpedance amplifier circuit and reducing foreign signal output voltage. With this scheme, the transimpedance amplifier circuit of the present invention can achieve a high convertion gain of both voltage and current and a high sensitivity in detection of a current signal with less foreign mixed signals.

After having finished reading over the above detailed description of the present invention, one may clearly understand that the present invention has several features which are distinctly superior to any conventional techniques and are as follows:

1. High current input efficiency and wider frequency band of the circuit may be achieved by the buffer circuit for signal current input.

2. The simulation resistance circuit permits flowing of a large amount of background DC when operating at a low frequency, while being able to improve coupling efficiency of signal current to the transimpedance amplifier circuit and reduce foreign mixed output signal when operating at a high frequency.

3. The transimpedance amplifier circuit of the present invention can achieve a high conversion gain of voltage and current and a high sensitivity in detection of a current signal.

Now, those who are skilled in the art will readily perceive how to modify the invention. Therefore the appended claims are to be construed to cover all equivalent structures which fall within the true scope and spirit of the invention.

What is claimed is:

1. A transimpedance amplifier circuit comprising:
   a buffer circuit for inputting a signal current being able to effectively transmit a signal current to an input node of said transimpedance amplifier circuit, and also isolating a capacitor effect which will possibly existing in the signal source so as to widen circuit frequency band;
   a simulation resistor circuit for permitting a large amount of background DC to flow through when operating at a low frequency, while improving the signal coupling efficiency and reducing foreign signal output voltage when operating at a high frequency so as to cause said transimpedance amplifier circuit to obtain a high sensitivity and large amplification factor in detecting a current signal; and
   an amplifier circuit for amplifying a signal.

2. The transimpedance amplifier circuit of claim 1, wherein said buffer circuit is composed of a resistor Rj, two FETS $J_1$ and $J_2$.

3. The transimpedance amplifier circuit of claim 2, wherein a current source for said buffer circuit is formed of connecting said $FETJ_1$ and resistor Rj in series.

4. The transimpedance amplifier circuit of claim 2, wherein the source voltage of said $FLETJ_1$ in said buffer circuit is fixed at a constant value, and said source voltage of said $FETJ_1$ is further able to fix the gate voltage of said $FETJ_2$ thereby forming a cascade stacking scheme.

5. The transimpedance amplifier circuit of claim 3, wherein the connecting point of the drain of said $FETJ_1$ and source of said $FETJ_2$ in said buffer circuit forms an input point of the signal current.

6. The transimpedance amplifier circuit of claim 1, wherein said simulation resistor circuit is constituted by a resistor $R_1$; a coupling capacitor $C_2$; a biasing resistor Rb; a first buffer unit $U_1$, and a second buffer unit $U_2$.

7. The transimpedance amplifier circuit of claim 6, wherein the structure of said simulation resistor circuit is such that said first buffer unit $U_1$ picks up the voltage at the input node A of said transimpedance amplifier circuit, while the output of said second buffer unit $U_2$ controls voltage at the input node A after passing through said biasing resistor Rb, and the output end of said first buffer unit $U_1$ is connected to the input end of said second buffer unit $U_2$ via said coupling capacitor $C_2$.

8. The transimpedance amplifier circuit of claim 6, wherein said two units of buffers $U_1$ and $U_2$ are connected with each other via said coupling capacitor $C_2$ so as to form a shoestring structure by capacitor coupling.

* * * * *